(12) United States Patent
Potkonjak

(10) Patent No.: US 8,286,120 B2
(45) Date of Patent: Oct. 9, 2012

(54) NON-INVASIVE LEAKAGE POWER DEVICE CHARACTERIZATION OF INTEGRATED CIRCUITS USING DEVICE GROUPING AND COMPRESSIVE SENSING

(75) Inventor: Miodrag Potkonjak, Los Angeles, CA (US)

(73) Assignee: Empire Technology Development, LLC, Wilmington, DE (US)

( * ) Notice: Subject to any disclaimer, the term of this patent is extended or adjusted under 35 U.S.C. 154(b) by 415 days.

(21) Appl. No.: 12/541,098

(22) Filed: Aug. 13, 2009

(65) Prior Publication Data
US 2011/0041115 A1 Feb. 17, 2011

(51) Int. Cl.
*G06F 17/50* (2006.01)
(52) U.S. Cl. ......................... 716/133; 716/120
(58) Field of Classification Search .......... 716/118–120, 716/132–133
See application file for complete search history.

(56) References Cited

U.S. PATENT DOCUMENTS

| | | | |
|---|---|---|---|
| 7,017,126 B2 | 3/2006 | Potkoniak et al. | |
| 7,065,720 B2 * | 6/2006 | Croix | 716/115 |
| 7,467,359 B2 | 12/2008 | Potkonjak et al. | |
| 7,793,241 B2 * | 9/2010 | Tai et al. | 716/115 |
| 7,900,184 B2 | 3/2011 | Potkonjak et al. | |
| 8,051,396 B2 * | 11/2011 | Beerel et al. | 716/104 |
| 2006/0031795 A1 * | 2/2006 | Rahmat et al. | 716/5 |
| 2007/0244676 A1 * | 10/2007 | Shang et al. | 703/2 |
| 2008/0005707 A1 * | 1/2008 | Papanikolaou et al. | 716/4 |
| 2008/0052654 A1 * | 2/2008 | Rahmat et al. | 716/6 |
| 2008/0066026 A1 * | 3/2008 | Tai et al. | 716/4 |
| 2010/0308895 A1 | 12/2010 | Koushanfar et al. | |

OTHER PUBLICATIONS

Sato, M., et al., "A 90 nm CMOS highly linear clock bootstrapped RF sampler operating at wide frequency range of 0.5 GHz to 5 Ghz". Jun. 2009, Radio Frequency Integrated Circuits Symposium, 2009, RFIC 2009. IEEE. pp. 391-394.*
Abdollahi, A. et al., "Leakage current reduction in CMOS VLSI circuits by input vector control," IEEE Trans. VLSI, 12(2):140-154, 2004.
Alkabani, Y. et al., "Active hardware metering for intellectual property protection and security." in USENIX Security, pp. 291-306, 2007.
Chandrakasan, A. et al., "Optimizing power using transformations." IEEE Trans. on CAD, 14(1):12-31, 1995.
Hong, D. et al., "Power Optimization of Variable Voltage Core-based Systems", IEEE Transaction on CAD, vol. 18, No. 12, pp. 1702-1714, Dec. 1999.

(Continued)

*Primary Examiner* — Stacy Whitmore
(74) *Attorney, Agent, or Firm* — Steven S. Rubin, Esq.; Moritt Hock & Hamroff LLP

(57) ABSTRACT

Techniques are generally described for non-invasive, post-silicon characterization of—leakage power for devices of an integrated circuit (IC). A system of sparse leakage power equations may be developed for the devices (e.g. gates) within the IC to be solved using compressive sensing (CS) techniques. Input Vectors (IV) may be applied at input terminal of the IC, and power of the IC may be measured. The measurements may be used in conjunction with the set of sparse equations to determine leakage power values for individual devices, not directly accessible. Pre-processing and post-processing techniques may be employed to make the system of equations more sparse and further improve the efficiency of applying CS techniques to solve the equation. Example processing may include variable splitting, device grouping, IV and equation selection, measurement under elevated IC temperature, and bootstrapping. Other aspects may be disclosed and claimed.

11 Claims, 9 Drawing Sheets

OTHER PUBLICATIONS

Figure 1:
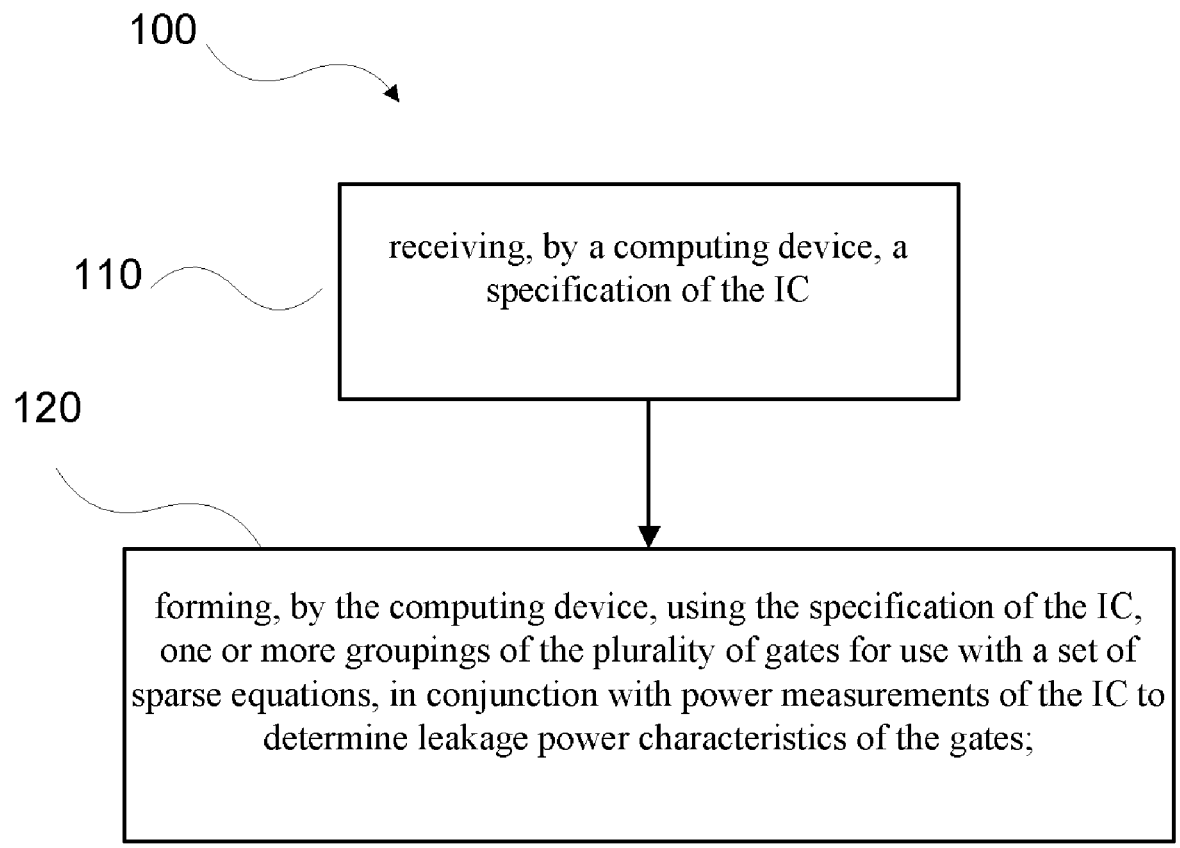

Chang, H. et al., "Full-chip analysis of leakage power under process variations, including spatial correlations." in DAC, pp. 523-528, 2005.
Mukhopadhyay, S. et al., "Accurate estimation of total leakage in nanometer-scale bulk CMOS circuits based on device geometry and doping profile." IEEE Trans. on CAD, 24(3):363-381, 2005.
Yuan, L. et al., "A combined gate replacement and input vector control approach for leakage current reduction. IEEE Trans." on VLSI, 14(2):173-182, 2006.
Wei, S. et al., "Scalable Hardware Trojan Diagnosis", accepted for publication, IEEE Transactions on Very Large Scale Integration (VLSI) Systems, 2011.
Wei, S. et al., "Malicious Circuitry Detection Using Thermal Conditioning", accepted for publication, IEEE Transactions on Information Forensics and Security, 2011.
Vahdatpour, A. et al., "A Gate-Level Sensor Network for Integrated Circuits Temperature Monitoring", IEEE Sensors, pp. 625-655, 2010.
Meguerdichian, S. et al., "Matched Public PUF: Ultra Low Energy Security Platform", International Symposium on Low Power Electronics and Design, accepted for publication, Aug. 2011.
Wei, S. et al., "Scalable Consistency-based Hardware Trojan Detection and Diagnosis", The 5th International Conference on Network and System Security, accepted for publication, Sep. 2011.
Wei, S. et al., "Integrated Circuit Digital Rights Management Techniques Using Physical Level Characterization", ACM Workshop on Digital Rights Management 2011, accepted for publication, Oct. 2011.
Ex Parte Quayle Action, issued in U.S. Appl. No. 12/550,119, mailed Nov. 2, 2011.
Alkabani, Y et al., "Input vector control for post-silicon leakage current minimization in the presence of manufacturing variability," 45th Design Automation Conference, Jun. 8, 2008, pp. 606-609.
Dabiri, F. et al., "Hardware aging-based software metering," Design, Automation and Test in Europe, Apr. 20, 2009, pp. 460-465.
Nelson, M. et al., "SVD-Based Ghost Circuitry Detection," 11th Information Hiding, Jun. 7, 2009, pp. 221-234.
Beckmann, N. et al., "Hardware-Based Public-Key Cryptography with Public Physically Unclonable Functions," 11th Information Hiding, Jun. 7, 2009, pp. 206-220.
Potkonjak, M. et al., "Hardware Trojan horse detection using gate-level characterization," 46th Design Automation Conference, Jul. 26, 2009, pp. 688-693.
Wei, S. et al., "Gate-level characterization: foundations and hardware security applications," 47th Design Automation Conference, Jun. 13, 2010, pp. 222-227.
Vahdatpour, A. et al., "Leakage Minimization Using Self Sensing and Thermal Management," International Symposium on Low Power Electronics and Design, Aug. 18, 2010, pp. 265-270.
Wei, S. et al., "Scalable Segmentation-Based Malicious Circuitry Detection and Diagnosis," International Conference on Computer-Aided Design, Nov. 7, 2010, pp. 483-486.
Koushanfar, F. et al., "Post-silicon timing characterization by compressed sensing," International Conference on Computer-Aided Design, Nov. 10, 2008, pp. 185-189.
Li, X. et al., "Virtual probe: a statistically optimal framework for minimum-cost silicon characterization of nanoscale integrated circuits," International Conference on Computer-Aided Design, Nov. 2, 2009, pp. 433-440.
Zhang, W. et al., "Bayesian virtual probe: minimizing variation characterization cost for nanoscale IC technologies via Bayesian inference," 47th Design Automation Conference, Jun. 13, 2010, pp. 262-267.
Shamsi, D. et al., "Noninvasive leakage power tomography of integrated circuits by compressive sensing," International Symposium on Low Power Electronics and Design, Aug. 11, 2008, pp. 341-346.
Meguerdichian, S. et al., "Device Aging-Based Physically Unclonable Functions," Design Automation Conference, Jun. 5, 2011, 2 pages.
Potkonjak, M. et al., "Differential Public Physically Unclonable Functions: Architecture and Applications," Design Automation Conference, Jun. 5, 2011, 6 pages.
Wei, S. et al., "Integrated Circuit Security Techniques Using Variable Supply Voltage," 48th Design Automation Conference, Jun. 5, 2011, pp. 248-253.
Agarwal, K., et al., "A Test Structure for Characterizing Local Device Mismatches," in Symposium on VLSI Circuits, pp. 67-68, 2006.
Alkabani, Y., et al., "Trusted Integrated Circuits: A Nondestructive Hidden Characteristics Extraction Approach," in Information Hiding, pp. 102-117, Springer-Verlag Berlin Heidelberg, 2008.
Baraniuk, R., "A Lecture On Compressive Sensing," IEEE Signal Processing Magazine, vol. 24, No. 4, pp. 118-121, 2007.
Candes, E.J., "Compressive Sampling," in Proceedings of the International Congress of Mathematicians, pp. 1433-1452, Madrid, Spain, 2006.
Cao, Y. and Clark, L.T., "Mapping Statistical Process Variations Toward Circuit Performance Variability: An Analytical Modeling Approach," in Proceedings of the 42nd Design Automation Conference, pp. 658-663, 2005.
Cline, B., et al., "Analysis and Modeling of CD Variation for Statistical Static Timing," in ICCAD, pp. 60-66, 2006.
Doh, J., et al., "A Unified Statistical Model for Inter-Die and Intra-Die Process Variation," in SISPAD, pp. 131-134, 2005.
Donoho, D.L., "Compressed Sensing," IEEE Transaction on Information Theory, vol. 52, issue 4, pp. 1289-1306, 2006.
Feng, Z., et al., "Fast Second-Order Statistical Static Timing Analysis Using Parameter Dimension Reduction," in DAC, pp. 244-249, 2007.
Friedberg, P., et al., "Modeling Within-Die Spatial Correlation Effects for Process-Design Co-Optimization," in ISQED, pp. 516-521, 2005.
Hargreaves, B., et al., "Within-die Process Variations: How Accurately Can They Be Statistically Modeled?" in ASP-DAC, pp. 524-530, Seoul, 2008.
Iyengar, V., et al., "Variation-Aware Performance Verification Using At-Speed Structural Test and Statistical Timing," in ICCAD, pp. 405-412, 2007.
Kim, N., et al., "Leakage Current—Moore's Law Meets Static Power," IEEE Computer, vol. 36, No. 12, pp. 68-57, 2003.
Koushanfar, F. and Potkonjak, M. "Cad-Based Security, Cryptography, and Digital Rights Management," in DAC, 2007.
Liu, B., "Spatial Correlation Extraction via Random Field Simulation and Production Chip Performance Regression," in DATE, pp. 527-532, 2008.
Liu, F., "A General Framework for Spatial Correlation Modeling in VLSI Design," Proc. Design Automation Conference, pp. 817-822, 2007.
Liu, Q. and Sapatnekar, S.S., "Confidence Scalable Post-Silicon Statistical Delay Prediction under Process Variations," in DAC, pp. 497-502, 2007.
Lu, X., et al., "Longest Path Selection for Delay Test under Process Variation," in ASP-DAC, pp. 98-103, 2004.
Mallat, S., "A Wavelet Tour of Signal Processing," Academic Press, 1999.
Meng, K. and Joseph, R., "Process Variation Aware Cache Leakage Management," in ISLPED, pp. 262-267, 2006.
Murakami, A., et al., "Selection of Potentially Testable Path Delay Faults for Test Generation," in ITC, pp. 376, 2000.
Ramalingam, A., et al., "An Accurate Sparse Matrix Based Framework for Statistical Static Timing Analysis," in ICCAD, pp. 231-236, 2006.
Rao, R., et al, "Statistical Estimation of Leakage Current Considering Inter- and Intra-Die Process Variation," in ISLPED, Aug. 25-27, pp. 84-89, Seoul, Korea, 2003.
Taghavi, T., et al., "Dragon2005: Large-Scale Mixed-Size Placement Tool," in ISPD, pp. 245-247, San Francisco, California, USA, 2005.
Xiong, J., et al., "Robust Extraction of Spatial Correlation," in ISPD, pp. 2-9, San Jose, California, USA, 2006.
Zhao, W., et al., "Rigorous Extraction of Process Variations for 65-nm CMOS Design," in ESSCIRC, pp. 89-92, 2007.

\* cited by examiner

Computing Program Product 801

Signal Bearing Medium 803

805
One or more instructions to:

- cause an apparatus to determine a system of leakage power equations for the devices or gates within an IC;
- cause the apparatus to preprocess the system of equations according to a number of techniques such as grouping devices, splitting variables, splitting equations, and using e.g. multiple approximation grids, to make the equations sparse and suitable for use with compressive sensing; and/or
- cause the apparatus to post-process the results of solving the leakage power equations.

| 807<br>A computer readable medium | 809<br>A recordable medium | 811<br>A communications medium |
|---|---|---|

Fig. 8

NON-INVASIVE LEAKAGE POWER DEVICE CHARACTERIZATION OF INTEGRATED CIRCUITS USING DEVICE GROUPING AND COMPRESSIVE SENSING

BACKGROUND

Leakage power measurement and characterization of Integrated Circuits (IC) may be important in many design, run time management, and testing tasks. Manufacturing variability and operational and environmental conditions in post-silicon IC's may render leakage power characteristics of various devices, such as transistors, gates and so forth, unpredictable and/or unknown. Component feature sizes, for example, CMOS (Complementary Metal Oxide Semiconductor) features, are often aggressively scaled down to meet the growing demand for lowering the cost-per-function by increasing the device density and computational speed. Because of the random inaccuracy in manufacturing at small scales, variations in device feature sizes tend to be pretty common. As a result, Very Large Scale Integrated (VLSI) circuits may show highly variable power characteristics. The power consumption of an IC may not a deterministic function of the design at VLSI scales, where each chip may exhibit a specific profile for both static and dynamic power consumptions.

Technology scaling has also generally caused power behavior to become a substantive design objective for many classes of ICs and for systems that include the ICs. Initially, power switching was typically the dominant power consideration in the IC design process. However, technology scaling may have had an impact on the static (leakage) power consumption of circuits. Due to unabated silicon feature scaling, elevated leakage current has tend to become an increasingly dominant power consideration in the recent and future designs of ICs. Indeed, there are predictions that leakage current may surpass power switching as the dominant design consideration in upcoming generations of scaled circuit designs.

BRIEF DESCRIPTION OF THE DRAWINGS

Subject matter is particularly pointed out and distinctly claimed in the concluding portion of the specification. The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings. Various embodiments will be described referencing the accompanying drawings in which like references denote similar elements, and in which:

FIG. 1 is a flowchart of an illustrative method for characterizing leakage power of devices of an IC including grouping of devices;

FIG. 2 illustrates an illustrative apparatus that includes an IC suitable to practice various embodiments;

FIG. 3 is a schematic diagram of an illustrative circuit and a table illustrating the potential impact of manufacturing variability (MV) on leakage current in response to application of an input vector;

FIG. 4 is a block diagram showing an illustrative test apparatus to practice various embodiments;

FIG. 5 shows an illustrative circuit diagram and corresponding table illustrating gate input transitions;

FIG. 6 is a flowchart of embodiments of the method of FIG. 1 including the use of gate-level grouping;

FIG. 7 is a flowchart of an illustrative method for selecting sparse equations based on application of Input Vectors (IV) to the IC;

FIG. 8 shows an illustrative article of manufacture including a computing program product; and FIG. 9 shows an illustrative computing device/system that may be suitable for practicing various embodiments, all arranged in accordance with embodiments of the present disclosure.

DETAILED DESCRIPTION OF ILLUSTRATIVE EMBODIMENTS

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figs., may be arranged, substituted, combined, and designed in a wide variety of different configurations, all of which are explicitly contemplated and make part of this disclosure.

In the following description, algorithms and/or symbolic representations of operations on data bits and/or binary digital signals stored within a computing system, such as within a computer and/or computing system memory may be presented. An algorithm is generally considered to be a self-consistent sequence of operations and/or similar processing leading to a desired result where the operations may involve physical manipulations of physical quantities that may take the form of electrical, magnetic and/or electromagnetic signals capable of being stored, transferred, combined, compared and/or otherwise manipulated. In various contexts such signals may be referred to as bits, data, values, elements, symbols, characters, terms, numbers, numerals, etc. Those skilled in the art will recognize, however, that such terms may be used to connote physical quantities. Hence, when terms such as "storing", "processing", "retrieving", "calculating", "determining" etc. are used in this description they may refer to the actions of a computing platform, such as a computer or a similar electronic computing device such as a cellular telephone, that manipulates and/or transforms data represented as physical quantities including electronic and/or magnetic quantities within the computing platform's processors, memories, registers, etc.

This disclosure is drawn, inter alias to methods, apparatus, systems and computer program products related to characterizing leakage current and/or power of devices of ICs. Economically and practically feasible, non-invasive and/or nondestructive measurement techniques for characterization of various parameters for devices of an IC, including leakage power, may be desirable. The large size of modern IC's having tens of thousands or more devices, often prevents effective use of many traditional algebraic and numerical techniques, simulations, statistical analysis, and the like, that can be used for device-level leakage power estimation and characterization. Additionally, invasive methods, such as opening an IC's packaging for testing, have been used for leakage power characterization, but such approaches generally may be of limited value because each IC may be slightly different from others due to manufacturing variability.

Overview of Illustrative Methods

A fast, robust, non-invasive, non-destructive, post-silicon method, based on device grouping and sparse equations, is disclosed for gate-level leakage power characterization of devices that may be suitable for use in large IC's. In some embodiments, example methods may include determining a system of sparse leakage power equations for devices, at the gate-level, within the IC based on input vectors applied at input terminals of the IC. Gate-level devices may include logic gates, transmission gates, switches and other devices. Power of the IC responsive to the application of the input vectors may be measured and used in conjunction with the set of sparse equations to solve for the leakage power values for individual devices inside the IC, not directly accessible or observable. The system of equations may be pre-processed according to a number techniques such as grouping devices, splitting variables, splitting equations, and using multiple approximation grids, among others, more fully described below, to make the equations more sparse and suitable for use with compressive sensing. In addition, post-processing of computation results, such as performing multiple runs of measurements, and conducting learn and test procedure, among others, more fully described below, may be utilized to further improve the accuracy of leakage power characterization. Compressive sensing may generally depend on sparseness of the equation to significantly reduce the computation needed to solve the equations. Once the measurements are obtained, the measurements may be used with the sparse system of equations to determine the unknown leakage power values for individual devices.

The grouping of devices (e.g. gates) may be generally done based on criteria of how similar the devices are to each other. For example, devices that have close physical proximity in the IC may be likely similar in leakage characteristics and may thus be grouped together. Grouping devices together or using approximation grids may effectively reduce the number of devices and corresponding variables in the system of equations by using the group or grid to represent many similar devices.

FIG. 1 is a flowchart of an illustrative method for characterizing leakage power for devices of an IC including grouping of devices, in accordance with various embodiments of the present disclosure. At block 110 of method 100 ("receiving, by a computing device, a specification of the IC") a description of an IC, e.g. at gate-levels, in terms of device configurations and connections may be provided to a computing device. In some embodiments, the description of devices may be in the form of a Hardware Description Language (HDL), such as VHDL or Verilog©. Other formats and methods may also be used to represent hardware description, such as using a netlist (showing connectivity of circuit elements for CAD (Computer Aided Design) programs), MATLAB©, RTL (Register Transfer Language), XML (eXtensible Markup Language used for data definition/representation), or general programming languages such as C++ and C#.

At block 120 ("forming, by the computing device, using the specification, one or more groupings of the plurality of devices (e.g. gates) for use with a set of sparse equations, in conjunction with power measurements of the IC to determine leakage power characteristics of the gates"), using the computing device, the specification of the devices within the IC may be used to derive a set of leakage power modeling equations based on suitable input vectors (IVs) that may make such system of equations sparse. Sparseness of the system of equations may generally be manifested in terms of variable coefficients having a value of zero or near zero in the equations. A system of linear equations may be represented using matrices as a mathematical shorthand notation. Accordingly, the matrices, which contain these coefficients, will be sparse where most of the entries are zero or near zero. Computation of such sparse matrices may be performed significantly faster and with fewer computational resources, such as memory, than same size non-sparse matrices.

Various embodiments of method 100 will be further described below with reference to FIGS. 2-7. In particular, various embodiments employing gate-level characterization of the ICs will be described. However, as noted earlier, the present disclosure may be practiced with other levels of characterization of the IC. Briefly, as an overview, for these embodiments, gate-level characterizations may first be performed for one or more ICs that implement the same circuit design but that differ from each other due to manufacturing variability. The gate-level characterizations may represent the effects of manufacturing variability on the leakage current and/or power of the devices in each IC. Those skilled in the art will appreciate that power is a function of current. As such, measurement of the current of the IC may generally correlate with power. Accordingly, in the rest of this disclosure the terms "current" and "power" may be used interchangeably unless specifically differentiated. Next, N instances of the ICs that each model the gate-level characterizations may be selected (or generated for embodiments employing software equivalent instances of the IC) such that each of the N instances of the ICs may also represent the effects of manufacturing variability on their respective leakage current. Then, the input vectors (IV) that make a significant number of coefficients in the leakage power modeling equations zero or near zero may be selected. By applying the selected IVs and taking relatively few measurements of the resulting total power consumption of the IC, the equations may be solved, using the computing device and applying compressive sensing techniques, to determine the leakage power characteristic of each device individually.

Some embodiments may provide an article of manufacture that comprises a tangible computer-readable medium, such as a memory or other physical storage device, having stored thereon, computer-executable instructions that, when executed by a computing device, that may cause the computing device to perform at least some of the operations of method 100. An example embodiment of such a computer-readable medium will be further described below with references to FIG. 8, and an example of such a computing device may include the test apparatus 402 of FIG. 4, which will be described further below with references to FIG. 9.

In some embodiments, as the IC ages, the gate-level characterization can be repeated so as to find other input vectors to characterize leakage power, as the leakage current of certain devices (such as highly used gates, for example) may increase over time.

Before further describing embodiments of the present disclosure, it should be noted that some embodiments address at least two major challenges so as to provide an efficient technique for selecting IVs to characterize leakage power of devices of a plurality of ICs having the same design but differ in manufacturing variability. When gate-level characterization is employed, the first challenge addressed by some embodiments is the extraction of the device characteristics of an IC, at gate-level by measuring only the overall leakage power for different inputs of the ICs. The second challenge addressed by some embodiments is the rapid generation of inputs that result in sparse leakage power modeling equations. As will be appreciated from the descriptions to follow, embodiments of the present disclosure attempt to effectively address these and other challenges.

Illustrative Device including an IC having Manufacturing Variability

Figure 2:
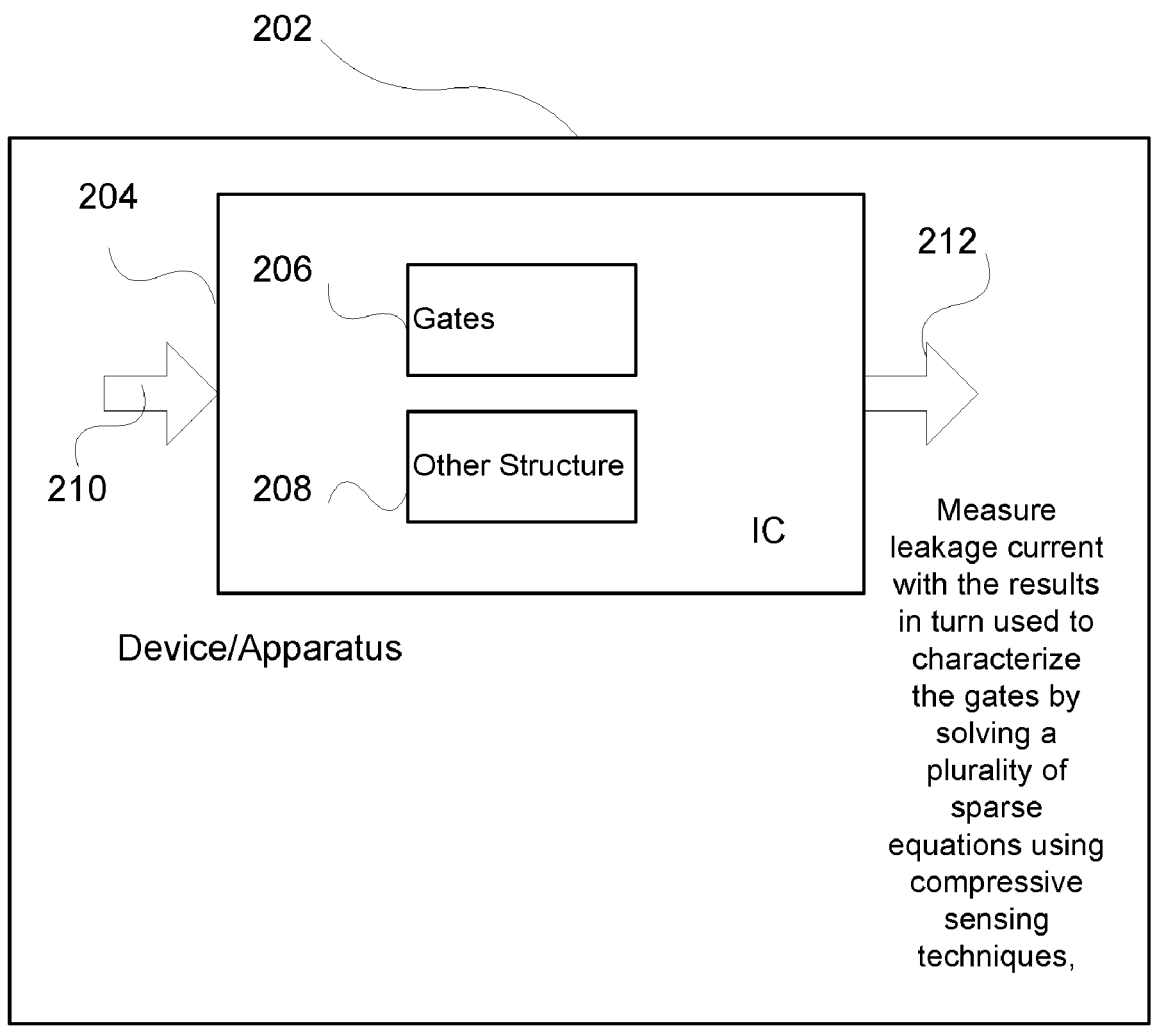

FIG. 2 illustrates an example apparatus 202 that includes an integrated circuit (IC) 204, which may be suitable for practicing various embodiments of the present disclosure. The apparatus 202 may include, for instance, a cellular telephone, a laptop computer, a desktop computer, a network apparatus (such as a server), or any other type of stationary or mobile electronic apparatus.

The IC 204 of some embodiments may include at least one input terminal 210 and at least one output terminal 106. As will be explained in further detail below, in some embodiments, an input vector may be applied to one or more of the input terminals 210 and the resulting leakage current may be measured, with the results in turn used to characterize the devices by solving a plurality of sparse equations, using compressive sensing techniques.

The IC 204 may include one or more devices, such as gates 206, and/or other structures 208 that implement a circuit design. For the sake of simplicity of explanation herein, the various structures of the IC 204 will be described in the context of "devices" such as "gates" (e.g. the gates 206) when describing techniques pertaining to the characterization of the effects of manufacturing variability (MV) and to the characterization of leakage power. The other structures 208 of the IC 204 may also have an effect on the leakage current and reduction or minimization thereof, but the effect of such other structures 208 are not described in further detail herein, for the sake of brevity. As note above also, the disclosure is not limited to gates only and may comprise numerous other circuit devices that may be digital or analog circuit components including, but not limited to, transistors, diodes, capacitors, inductors, resistors, and any other structures or devices that may be implemented in an IC. In various embodiments, the analog circuit elements may be collectively represented by a variable.

The IC 204 may have intrinsic MV that results from the manufacturing process. One or both of two types of MV may be present in the IC 204: i) inter-die variations (denoted by $\delta_{inter}$) that include die-to-die fluctuations (e.g. variations between the IC 204 and another IC that implements the same circuit design); and (ii) intra-die variations (denoted by $\delta_{intra}$) that may include the fluctuations present inside the single IC 204. It may be assumed that inter-die variations may similarly affect all the gates 206 on the single IC 204, while the intra-die variations may differently influence various ICs. The MV may generally represent that the variations may not be explicitly part of the circuit design and further may fluctuate within the IC 204 and/or between multiple ICs 204 that may implement the same circuit design.

Model for Leakage Current/Power Variation

As noted above, process variation may generally be categorized as intra-die and inter-die. The inter-die variation may represent the variation among different dies in the same wafer. The intra-die variation may refer to the variation among different devices on the same chip. Since the inter-die variation in constant over a specific chip, the present disclosure is focused on the inter-die variation. The intra-die variation may be modeled as an uncorrelated random variable and a spatially correlated random variable, both modeled as normally distributed.

Specifically, the Normal random variables describe variation of the device's dimensions. Because of the exponential relation between the leakage current (static power) and the device dimensions, the leakage current variation distribution may approximately be lognormal. Thus, power consumption may be reasonably modeled as having multiplicative variation, i.e., $p_u = s_u p^o_u$, where $p^o_u$ and $p_u$ may be considered as nominal power and real power consumption of a gate $g_u$, respectively, and $s_u$ may be considered as the scaling factor.

Impact of Manufacturing Variability

Figure 3:
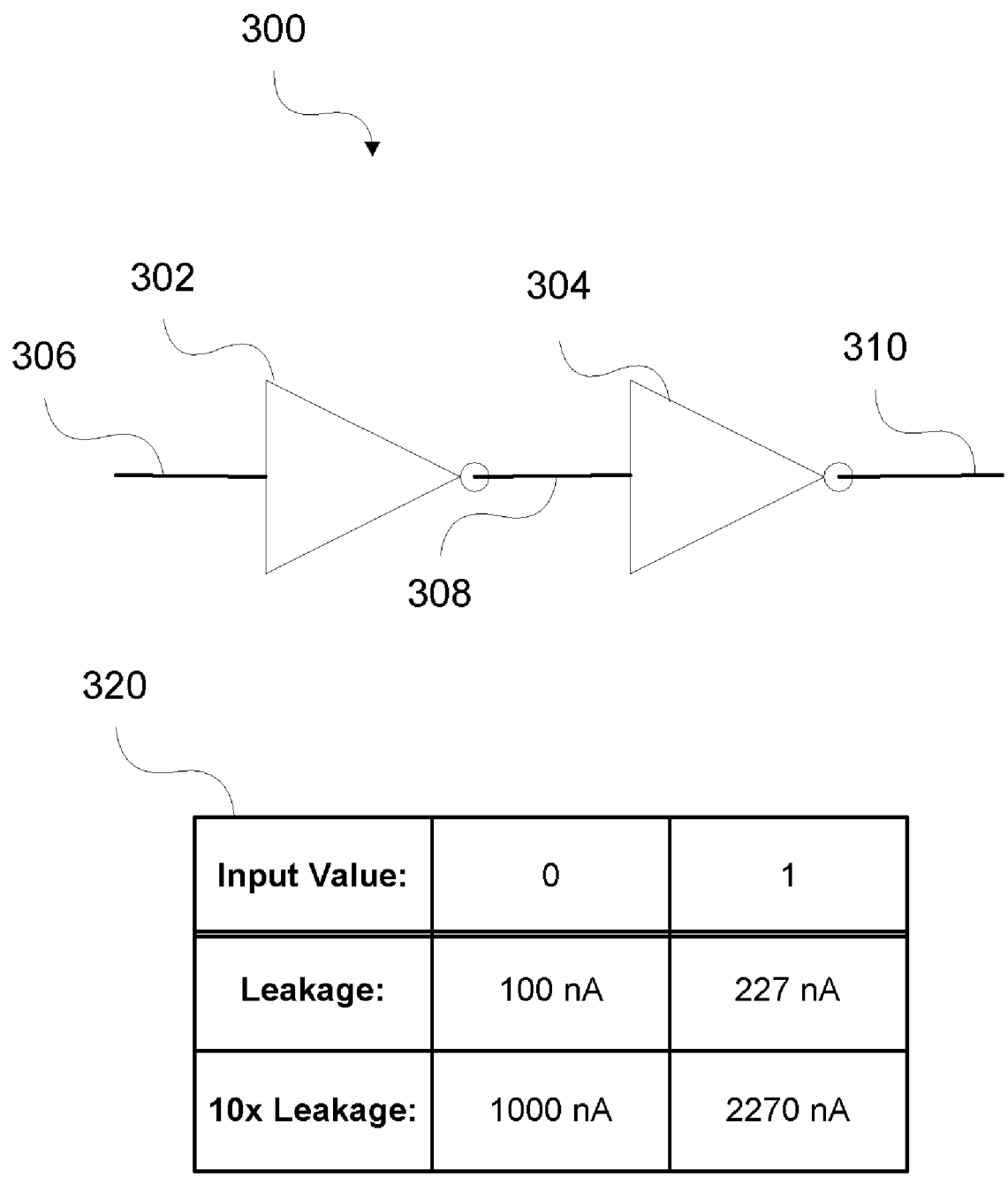

FIG. 3 is a schematic diagram of an illustrative circuit 300 and a table 320 illustrating the possible impact of MV on leakage current/power, in response to application of an input vector in accordance with various embodiments of the present disclosure. The design of the circuit 300 may include two inverters A (302) and B (304), where an output terminal 308 of inverter A forms an input terminal to the inverter B having an output terminal 310. The second row of the table 320 in FIG. 3 shows the example of a nominal leakage current for an inverter, and the third row of the table 320 shows an example of a ten-time increase in the leakage current as a consequence of the MV.

If, for example, the inverter A has the nominal leakage current, and the inverter B has a ten-fold larger leakage current, a binary input value of 1 provided to an input terminal 306 of the inverter A may yield an overall leakage current of 1227 nA. On other hand, if the inverter B has the nominal leakage current, and the inverter A has a ten-fold larger leakage current, a binary input value of 0 provided to the input terminal 306 may yield an overall leakage current of 2370 nA. Hence, a change in the input value may result in approximately 93% higher leakage current. Thus, MV considerations may play a role in determining the optimum IVs for leakage power characterization and determination of leakage power modeling equations for each IC.

Some embodiments described herein may employ statistical (clustering) and/or optimization techniques that include linear programming (LP), and integer linear programming (ILP). Clustering may be considered as a non-supervised statistical procedure that may identify the topological structure of the data by partitioning it into classes with instances that have similar properties. LP may provide provably optimal polynomial solutions to problems with linear objective function and linear constraints. ILP may address the same problem under the additional constraint that all or a subset of variables may be integers.

Use of Test Apparatus

Figure 4:
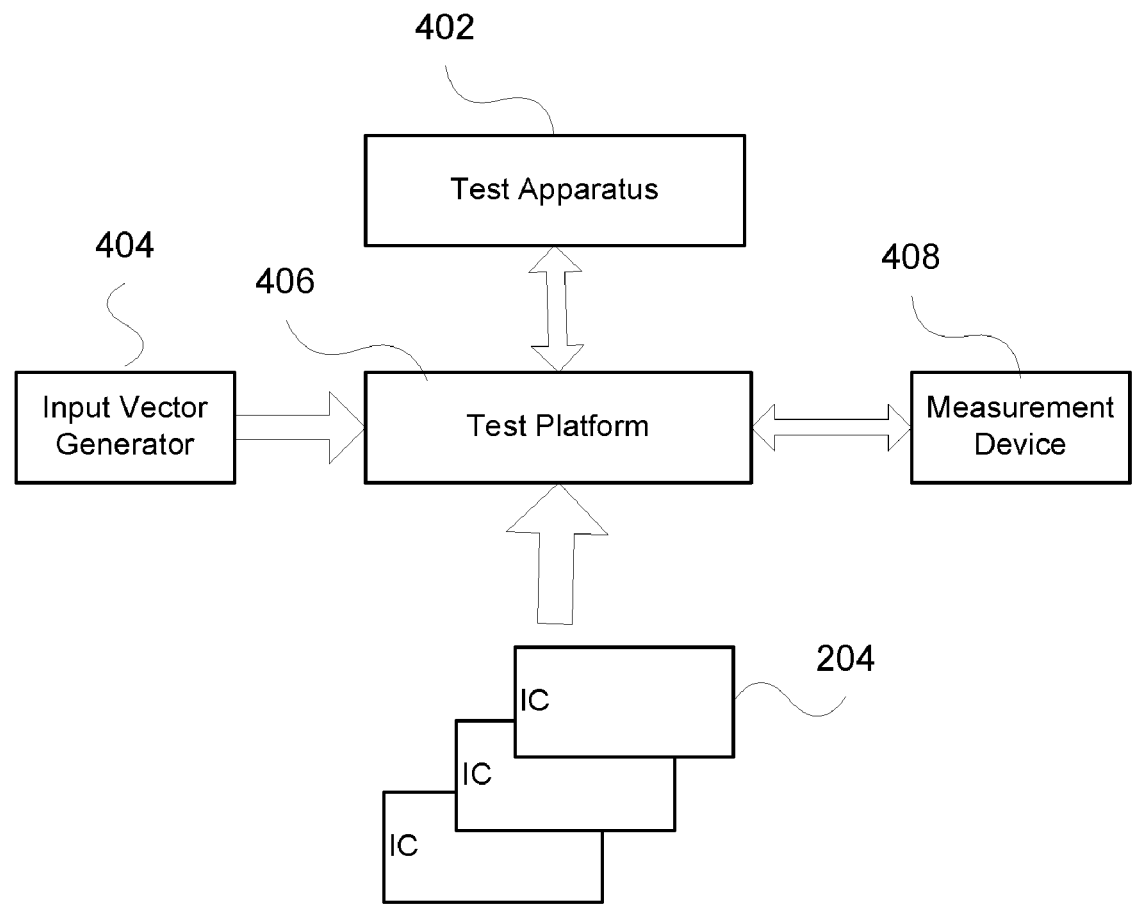

FIG. 4 is a block diagram illustrating the use of a test apparatus 402 to practice various embodiments of the present disclosure. Examples of techniques that can be used by the test apparatus 402 to perform gate-level characterization and to determine IVs that reduce or minimize leakage current for the devices of ICs 204 will be shown and described later below. In some embodiments, the test apparatus 402 may be implemented as a computing device, such as the computing device 900 that will be described with respect to FIG. 9.

The test apparatus 402 may include and/or be coupled to a test platform 406, an input vector generator 404, and at least one measurement apparatus 408. For the sake of clarity and simplicity of explanation hereinafter, the test platform 406, the input vector generator 404, and the measurement apparatus 408 are depicted in FIG. 4 as being separate from the test apparatus 402. However, in some embodiments, one or more of the test platform 406, the input vector generator 404, and the measurement apparatus 408 and/or their functionality may be integrated within the test apparatus 402.

The test apparatus 402 may be located at a manufacturing facility, test facility, or other location where gate-level characterization may be performed and/or where IVs to minimize or reduce leakage current for each IC 204 to a desired level may be determined. For example in an industrial setting, the test apparatus may be located at the manufacturing facility where ICs 204 have been fabricated, and at a next stage of the manufacturing/packaging process, the IV to characterize leakage current/power may be determined to configure/program the IC 204 or the device 202 that includes the IC 204, to describe and identify the IV in the product specification documents, and so forth.

The test platform 406 of some embodiments may include a circuit board or other platform on which the ICs 204 to be tested may be mounted. For instance in some embodiments, the test platform 406 may include a standard mounting mechanism for a device-under-test (DUT). Some embodiments of the test platform 406 may include, for example, a base with input and output terminals to respectively couple to the input terminal(s) 210 and the output terminal(s) 212 of the IC 204, for purposes of providing input signals (e.g., input vectors having binary values) to the IC 204, receiving output signals from the IC 204 that represent an amount of leakage current, providing power to the IC 204, providing control signals to the IC 204 (e.g. a control signal instructing the IC 204 to enter a low-power mode), and so forth. Such signals may be provided by the test apparatus 402, the input vector generator 404, and/or by another device (not shown).

The input vector generator 404 may be coupled to the test platform 406, and may be arranged to generate the IVs that are provided to the IC 204 mounted on the test platform 406. For example, if the IC 204 has four input terminals 210, the input vector generator 404 can be configured to generate an input vector [0001] such that binary values of 0, 0, 0, and 1 may be respectively provided to the four input terminals 306 of the IC 204.

In some embodiments, the input vector generator 404 may include a signal generator configured to generate one or more signals that may represent the input vector [0001], for example, that may be applied to the input terminals 210 of the IC 204. Other implementations of the input vector generator 404 may be provided, such as a current source, a voltage source, one or more logic gates or other logic circuitry, a finite state machine, a processor, a random number generator, or any other suitable software and/or hardware component that may be configurable to generate input vectors with different values and to provide the generated input vectors to one or more of the IC 204 mounted on the test platform 406. In some embodiments, the input vector generator 404 may be responsive to the test apparatus 402 to toggle values or to otherwise select and change the input vectors that are provided to the IC 204 mounted on the test platform 406.

In some embodiments, the measurement apparatus 408 may include one or more current meters that may be configured to measure current (e.g., leakage current) of the IC 204. The values of leakage current measured by the measurement apparatus 408 may be provided to the test apparatus 402, so that the test apparatus 402 can store and evaluate such values to determine which particular IV resulted in the most and/or sufficiently sparse leakage power modeling equations for each particular IC 204.

Non-Invasive Characterization

The overall measurement method for noninvasive gate-level characterization is now described. First, different IVs may be applied to the circuit and the total chip's leakage current for each such IV may be measured. Then an optimization problem to determine the process variation using the power measurements may be set up and solved. This process is illustrated with reference to an example circuit shown in FIG. 5.

Figure 5:
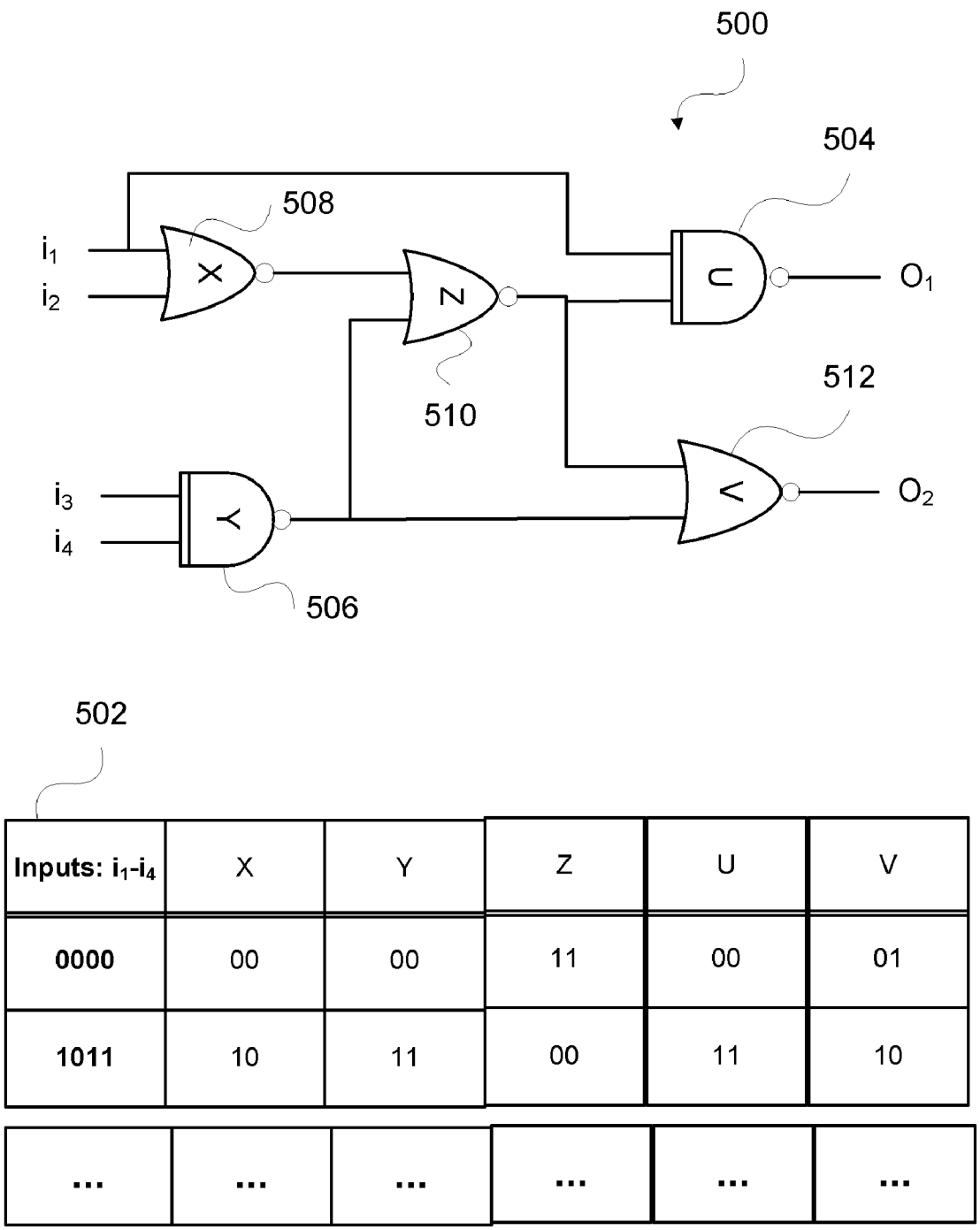

FIG. 5 shows an illustrative circuit diagram and corresponding table illustrating gate input transitions in accordance with various embodiments of the present disclosure. Example circuit 500 may be one of the circuits present on the IC 204. Table 502 shows the representative inputs to the example gates 206 of example circuit 500. In this example, the gate-level behavior of example circuit 500 is derived from two example NAND gates U (504) and Y (506) and three example NOR gates X (508), Z (510), and V (512). The table 502 shows the transitions at the input of each example gate X, Y, Z, U, and V depending on the IVs. Look-up tables for the leakage current for standard NAND/NOR gates may be readily available, for example, from the manufacturer of the gates and/or IC or from other sources, and may be used as nominal current leakage for the respective gates. For the sake of brevity, the effect of leakage current due to interconnects are not considered in this example, but may be factored into the computation in a straightforward way. Also, as noted before, the procedure described with respect to FIG. 5 may be equally applicable to devices other than logic gates, such as those noted above, like transistors, switches, and so forth.

For the example input states/signals $(i_1, i_2, i_3, i_4)$=0000 and 1011 provided to the circuit 500, the leakage current consumption of the circuit 500 may be as shown in the first two lines of Equation 4 below. In Equation 4, P denotes the measured power consumption (current) for each input state, while E is the error in measuring the current/power.

$$P(0000)+E_1=s_X P_{NOR}(00)+s_Y P_{NAND}(00)+s_Z P_{NOR}(11)+s_U P_{NAND}(00)+s_V P_{NOR}(01);$$

$$P(1011)+E_2=s_X P_{NOR}(10)+s_Y P_{NAND}(11)+s_Z P_{NOR}(00)+s_U P_{NAND}(11)+s_V P_{NOR}(10);$$

$$P(\ldots)+E_i=\ldots; i=3\ldots,M \quad (1)$$

In Equation 1, $P_{NOR}$ and $P_{NAND}$ are the leakage currents of the example NOR and NAND gates that can be extracted from look-up tables as mentioned above. The variables $s_X$, $s_Y$, $s_Z$, $s_U$, and $s_V$ may denote the scaling factors of the example gates X, Y, Z, U, and V, when compared to the standard/nominal gates of each type. The linear system comprising of power equations for M different inputs can be written in a similar way. The unknown quantities of Equation 4 are the scaling factors ($s_X$, $s_Y$, $s_Z$, $s_U$, and $s_V$) of the example gates X, Y, Z, U, and V and the measurement errors ($E_1, E_2, \ldots, E_i$).

By solving the optimization problem of reducing or minimizing a metric of errors, say $L_1$ norm of the errors $$\left(\text{i.e., } \min \sum_{m=1}^{M} |E_m|\right),$$

subject to the linear system of M equations, the unknown variables, that is, the respective scaling factor $s_X$, $s_Y$, $s_Z$, $s_U$, and $s_V$ of each actual (as opposed to nominal or standard) gate X, Y, Z, U, and V can be found.

The created equations for current at the gate level may be linear, and to create a new equation that is, with a high probability, independent from the other equations, the input test vectors may be changed and new measurements may be conducted. The L1 norm may be used as an objective function (OF) that is non-linear. The non-linear OF may be converted to a linear one by introducing m new auxiliary variables $E_{absm}$, and adding 2 m new constraints: for each m, $E_{absm} \geq E_m$ and $E_{absm} \geq E_m$.

The linearized OF would then be:

$$\min \sum_{m=1}^{M} E_{absm}.$$

To ensure or improve the likelihood that the above linear programming (LP) formulation may be solvable, some embodiments measure as many independent equations (rows) as the number of variables. Also, some embodiments ensure or attempt to ensure that there are no two or more columns that are linearly scaled versions of each other, since in that case the formulation may not have a unique solution. A final operation before solving the LP may include identifying the variables that are also a linear combination of a subset of other variables in all constraints. Sets of these variables may be grouped together into a single new variable in the constraint. After solving the LP, the scaling factor may be divided for each new variable, equally between the variables that were used to form the scaling factor.

With M IVs and N gates of IC 204, Equation (1) may be rewritten in summation form as:

$$P_{IVj} = \Sigma P_{gi} * s_{gi}, \ i = 1, \ldots, N \tag{2}$$

where: $P_{IVj}$ is the total power output of IC 204 as a result of input vector IVj, $P_{gi}$ is the power gate $g_i$, $s_{gi}$ is the scaling factor for gate $g_i$, and N is the number of gates $g_i$.

Equation (2) may be written in matrix form as follows:

$$P = Ad \tag{3}$$

where:
$P = [P_{IV1}, \ldots, P_{IVM}]^T$,
$d = [S_{g1}, \ldots, s_{gN}]^T$, and
A = an M×N measurement matrix with the following rows (and columns:
$P_{g1, b<1, 1>} \cdots P_{gN, b<1, N>}$
$P_{g1, b<1, 2>} \cdots P_{gN, b<2, N>}$
$\ldots$
$P_{g1, b<1, M>} \cdots P_{gN, b<M, N>}$
where $P_{gi, b<i, j>}$ is the power output of gate $g_i$, due to gate input $b<i, j>$ to gate gi as a result of IVj.

With N unknown variables ($s_i$, i=1 ... N), N independent measurements are needed to completely determine the solution of Equation (2). However, the measurement vectors (rows of matrix A) are usually dependent. In the presence of power measurement noise or error, the $l_2$—norm may be minimized:

$$\min \|Ad - p\|_2^2 \tag{4}$$

Each input vector IVj may determine a row of the measurement matrix A (power vector), according to the circuit topology. Thus, the rows of the measurement matrix may not necessarily be independent. To reduce dependency between the rows, and the size of matrix A, various methods, as more fully described below, may be used.

Compressive Sensing

Compressive Sensing (CS) is a numerical analysis technique that exploits sparseness of a set of linear equations. Specifically, given a vector x in an N-dimensional space which is K-sparse, that is, has only K non-zero components, using compressive sensing, this vector can be reconstructed with only M=O(K log(N/K)) linear measurements:

$$P = Ax + e, \tag{5}$$

where A is a M×N measurement matrix, P includes the measurements, and e is the measurement noise or error.

The sparse vector x can be recovered from the measurements using the following convex optimization:

$$\text{Min } \|x\|_1 + \lambda \|p - Ax\|_2^2 \tag{6}$$

For some appropriate $\lambda$ depending on the noise variance. In the absence of noise, under certain conditions on A, Equation (6) may be used to exactly recover x.

This formulation may be robust even if vector x is not sparse but is compressible. A compressible vector generally has very few significant coefficients and can be well approximated by a K-sparse representation. A good model for compressible vectors may be the weak norm $l_p$ ball for p<1, that is, the set of vectors whose coefficients decay as a power law:

$$|x|_{(i)} \leq r i^{-1/p}, \ 1 \leq i \leq N \tag{7}$$

where x=(x1, x2, ..., xN) and $x_{(i)}$ is i-th largest element of x.

In the same framework, a vector might be sparse in a sparseness-inducing basis W instead of a canonical domain. Specifically, if x=Ws, where s is sparse instead of x, and W is the sparseness-inducing basis, then Equation (5) becomes $$P = AWs + e, \tag{8}$$

Thus the problem may be reformulated as the recovery of a sparse s from y, acquired using the measurement matrix AW.

In some embodiments, devices may be located on a regular rectangular grid on the IC 204. Process variation on the regular grid may be denoted by $H = \{h_{s,t}\} s=1 \ldots T, t=1 \ldots R$, where $h_{s,t}$ may be variation of the device located at the (s, t)-th point of the grid. All the elements of the matrix H may be stacked in a long column vector S.

In other embodiments, because of the area and the device constraints, the devices may not be arranged on regular grids, but rather may be arranged in an irregular manner. In this embodiment, a dense regular grid may be used where the center of each gate is close to some grid point for all the gates in the IC 204. The variation of each device gi may be assigned to a point on the dense regular grid that is closest to the center of the device. If there are more than one closest point, one of them may be selected randomly. The remaining grid points may be assigned to free variables that do not correspond to physical gates and do not affect the measurements.

Models for Gate-Level Characterization

According to some embodiments, one or more models for MV, leakage current, and measurement error may be used as part of the gate-level characterization technique. Examples of such models are described below.

A. Variability Models

According to some embodiments, the MV may be modeled. As previously explained above, process variations may be generally divided into inter-die variations ($\delta_{inter}$) between ICs and intra-die variations ($\delta_{intra}$) within the IC 204.

To model intra-die variations, some embodiments may use equations from L. Cheng et al., "A fast simultaneous input vector generation and gate replacement algorithm for leakage power reduction," in *Annual ACM IEEE Design Automation Conference*, pages 117-120, 2006, and from A. Srivastava et al., "Statistical Analysis and Optimization for VLSI: Timing and Power," in Series on Integrated Circuits and Systems, 2005.

These equations model a parameter p located at (x, y) as p= $\bar{p}+\delta_x x+\delta_y y+\epsilon$, wherein $\bar{p}$ may be a nominal value of the parameter p at the (0, 0) die location; $\delta_x x$ and $\delta_y y$ may be gradients of the spatial variations of the parameter p in the x and y directions; and $\epsilon$ is a random intra-chip variation component. A multivariate normal distribution (MVN) may be used for modeling the vector of all random components across the chip and the intra-chip correlations among them. Furthermore, the grid model that partitions the space into grids may be used in some embodiments, where devices within the same grid may be highly correlated and devices in further grids may be correlated proportional to their distances

B. Leakage Current Model

The leakage current may be a function of the process variations. Some embodiments, for devices (such as, gates) may use the leakage model that takes into account the sub-threshold leakage current ($I_{sub}$) and the gate tunneling leakage current ($I_{gate}$). The two leakage currents may be estimated by empirical curve-fitted models as follows:

$$I_{sub} = a_0 w e^{a_1 + a_2 L + a_3 L^2 + a_4 T_{ox}^{-1} + a_5 T_{ox}} \quad (1)$$

$$I_{gate} = a'_0 w e^{a'_1 + a'_2 L + a'_3 L^2 + a'_4 T_{ox}^{-1} + a'_5 T_{ox}} \quad (2)$$

wherein a and a' may denote the fitting parameters; w may correspond to the gate width of the transistor; Tox may denote the gate oxide thickness; and L may be the effective gate length due to the short channel effect.

Since both leakage currents may be modeled as exponential functions, both of the leakage currents may be approximated by a lognormal distribution. The full leakage current of the chip may then be computed by summing the individual components as follows:

$$I_{total}^{avg} = \sum_{\forall gates\, i=1,\ldots,m} I_{sub_i}^{avg} + I_{gate_i}^{avg} \quad (3)$$

wherein m may be the total number of components and $I_{sub_i}^{avg}$ and $I_{gate_i}^{avg}$ may be computed using the dominant states.

The full-chip leakage distribution may be found by summing up the lognormal distributions of all gates considering spatial correlations. Theoretically, the sum may generally not be known to have a closed form, but may be approximated as a lognormal distribution using for example Wilkinson's method.

C. Measurement Error Model

In some embodiments, current may be measured from the external pins (such as the output terminal 212). Leakage current may be read out in a steady state, where dynamic power may not be present. Environmental conditions, noise, packaging, thermal effects and many other phenomena may affect the external current readings and cause measurement errors. The errors may vary from one design to the next (e.g. because of the differences in size, layout, and environment). The measurement error may be modeled with three different distributions: Gaussian distribution, uniform distribution, and/or triangular distribution, while the distribution variances may be varied. In some embodiments, linear optimization may reduce or minimize the discrepancy and may not depend on the shape of the measurement error. Any user-defined smooth distribution that has a limited number of discontinuities may be used.

Pre-processing for Compressive Sensing

As noted above, generally, compressive sensing (CS) may be used for solving the set of sparse equations. In some embodiments, IVs for IC 204 may be used to produce a measurement (for example, current or power t). Leakage power modeling equations may then be derived using the same IVs. This way, the same IVs that produce a power measurements may be used to set up the equations and thus, the measurements taken may be used with the equations, and solved using CS technique, yielding the desired device characterization solution.

A number of pre-processing techniques may be used to increase the sparseness of the set of equations. These techniques may include grouping devices (such as, gates) based on physical proximity, grouping devices (such as, gates) using multiple approximation grids, IV selection based on a scaling factor, IV selection based on a size/value of total leakage power, measurement under high temperature, IV selection based on number of variables, equation selection based on IV selection, equation selection based on distance (e.g., Hamming distance), and/or splitting variables. Each of these techniques is further described below.

Grouping devices (such as, gates) based on physical proximity may allow reduction of the number of equations and/or variables. It is expected that physically close devices, such as gates 206 in IC 204, may be more similar to each other, in terms of characteristics, such as leakage power, than other devices which are relatively distant from one another. This is, at least in part, because physically close devices may be subjected to similar physical and chemical phenomena and forces (e.g. stress/strain, temperature, etc) that affect the devices similarly. Therefore, there may be a significant locality in manufacturing variability. As such, devices in close physical proximity to each other may be grouped together and be assigned a single scaling factor for the group, rather than a separate scaling factor for each device (e.g., gate).

In some embodiments, grouping of devices (such as, gates) may start with two devices that are closest together to form a group. Next, more devices, which are within a threshold distance to any other devices located within the group, are added to the group. Once there are no more detives found that are within the threshold distances from any other device in the group, the group may be closed, and another group may be started. This process may be iteratively continued until all devices are assigned to a group. Different groups may be assigned the same or different threshold distances. In each group, the maximal or threshold distance between the devices within the group may be within a user-defined or predetermined threshold distance.

Figure 6:
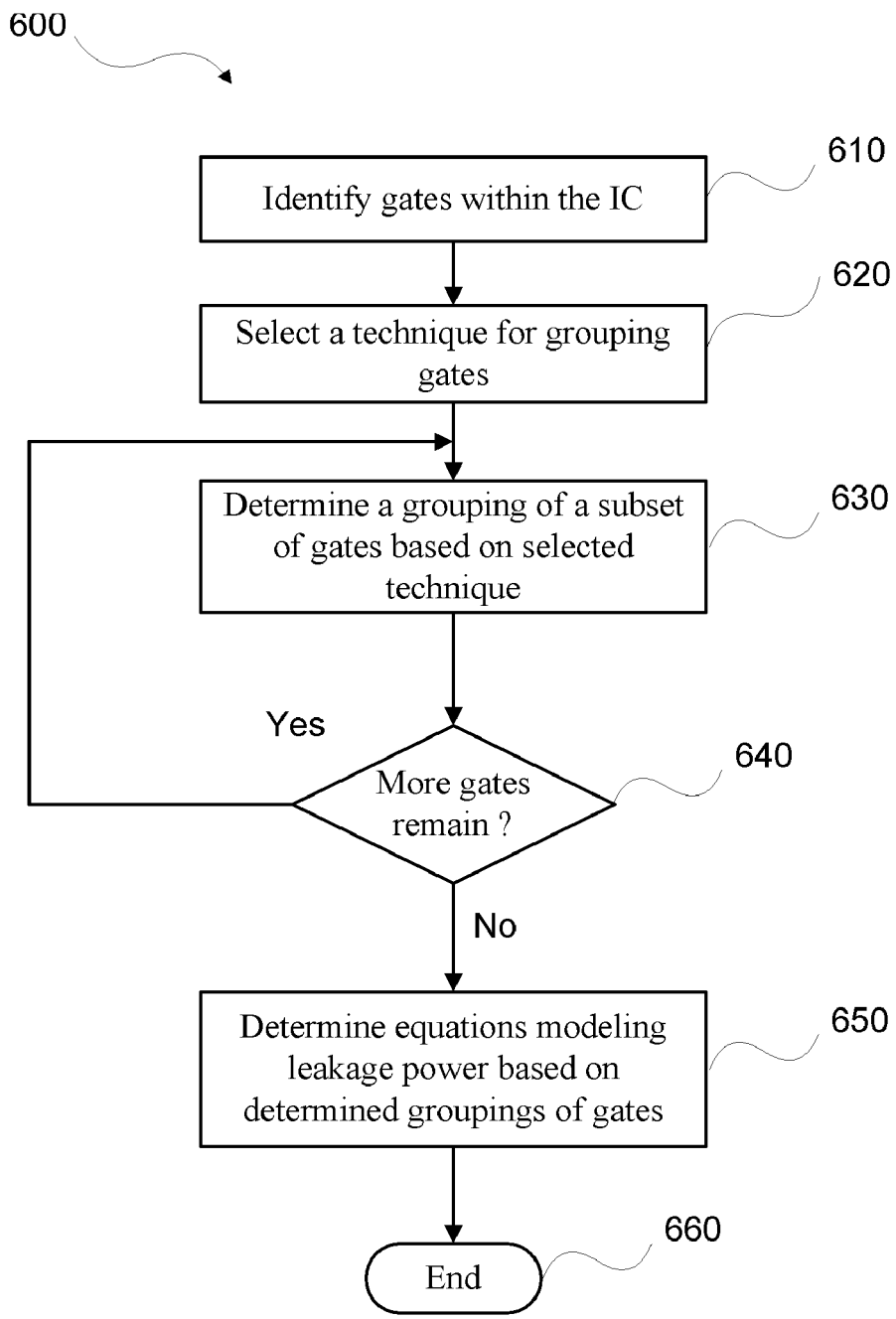

FIG. 6 is a flowchart of embodiments of the method of FIG. 1 including the use of gate-level grouping, in accordance with various embodiments of the present disclosure. For ease of understanding, the method of FIG. 6 will be described in the context of gates, however, as noted earlier, the method may be practiced including other devices of an IC. Method 600 may start at block 610 ("Identify gates within the IC") where gates within IC 204 may be identified for grouping. The identification of gates may include information about their position within the IC, relationship to other gates, and/or other locality information, such as density of gates, density gradient, and the like. As noted above, in some embodiments, the information related to the position of the gates may be included in a hardware specification file having a format such as HDL, netlist, RTL, XML, or general programming languages such as C++ and C#. In other embodiments, basic information about gates may be included in the hardware specification file while information about position of the gates relative to each other may be derived by computation by the computing device that may receive the hardware specification file.

At block 620 ("Select a technique for grouping gates"), one of several techniques may be used to associate multiple gates together and treat them as one gate for the purposes of measurement using CS and for derivation of equations. One technique for associating or grouping gates together may be the use of physical proximity of gates, as described above. Another technique may be the use of multiple approximation grids to associate or group gates with each other. By imposing multiple grids of different resolutions and phase shifts and mapping gates to such grids, the number of gates that may be used to form equations and the number of equations and/or variables to be solved using CS may be reduced. In some embodiments, a computational sweep algorithm may be used to find the best phase shifts of grids. In these embodiments, the boundaries of a target grid may be shifted in a "sliding window" fashion to cover different gates. In another embodiment, the quality of grid shifts may be calculated using the total or maximal distance of each gate to an intersection point of the grid. In this embodiment, the maximal distance acceptable for a desired quality level may be set to a predetermined value. Such maximal distance may be the same or different for different grids.

At block 630 ("Determine a grouping of a subset of gates based on selected technique"), the selected technique for gate grouping may be used to group gates together and form leakage power modeling equations on the basis of the grouped gates. Generally, one scaling factor $s_{gi}$ may be used for each group of gates so formed, applicable to all gates within the respective group.

At decision block 640 ("More gates remain?"), the process is adapted to ascertain whether there remain gates in IC 204 that are not yet assigned as members of a group. If additional gates are to be assigned, then the process may proceed to block 630. Otherwise, the process may proceed to block 650 when no additional gates are to be assigned.

At block 650 ("Determine equations modeling leakage power based on determined groupings of gates"), Equation (2) or equivalently, Equation (3), may be derived based on the scaling factors $s_{gi}$ assigned to the groups of gates. Thereafter, the process may terminate at block 660 ("End").

Another pre-processing technique may be IV selection based on a scaling factor. As noted above, application of IV to the input terminal 210 of IC 204 may cause an output signal, in the form of current or power output at the output terminal 212 of IC 204. A particular IV may be selected and applied so that at least the scaling variable/coefficient associated with one gate (or group of gates), has a different value than a value associated with any other IV that has already been applied. This way, the corresponding equations may be independent, reducing the rank of matrix A in Equation (3) and in turn, reducing the amount of computation required to solve Equation (3). In some embodiments, random IVs may be generated to change a single output at a time until an IV meeting the above requirement (i.e., finding a different scaling coefficient) is not found for a predetermined number of iterations. In other embodiments, the IVs may be generated using a predetermined order, as opposed to randomly, such as an alphabetical or a numerical order.

Another pre-processing technique may be IV selection based on a size/value of total leakage power. In this technique, an IV may be selected that results in relatively (with respect to other potential IVs) large overall leakage power. This operation may be beneficial because in presence of a constant error of measurements due to limitations of the instrumentation, the relative impact of the measurement error may be reduced when the measured quantity is relatively large.

Another pre-processing technique may be measurement under high temperature. Using this technique, IC 204 being characterized may be intentionally subjected to relatively higher temperatures than normal operating conditions, for example, room temperature (about 25° Celsius.) The increase of internal temperature of IC 204 may be accomplished using either external thermal sources, or intensive and controlled switching of gates 206. Since the leakage power increases exponentially with temperature, the relative errors of measurement may be exponentially reduced.

Another pre-processing technique may be IV selection based on number of variables. Using this technique, IV pairs may be selected that result in sparse output signals and corresponding equations that contain only a small number of variables that are different between the IVs in the pairs, where such variables are not zero or close to zero. By subtracting the equations corresponding to each of the IVs in the IV pairs from each other, new equations may be obtained that contain relatively fewer variables and are suitable for solution using CS techniques. Accordingly, the resulting system of equation may also be correspondingly sparse and easy to solve. One method of improving the accuracy of CS-based gate-level leakage power characterization may be using multiple measurements for the same pair of IVs. In some embodiments, all the measurements may be conducted K1 times in a round robin fashion, where K1 is a predetermined constant. In other embodiments, all the measurements may be conducted K1 times randomly.

Another pre-processing technique may be equation selection based on IV selection. This technique may be used in conjunction with the pre-processing technique of IV selection based on number of variables. Sparse equations, created using the technique of IV selection based on number of variables, may be selected, where such sparse equations have a higher chance of resulting in accurate gate-level leakage power characterization using CS while reducing or minimizing the number of variables and/or equations. In some embodiments, the sparse equations may be selected to allow as many variables as possible to appear in an equal number of equations. For example, this technique may allow 20 variables each to appear in 12 equations, and not necessarily the same 12 equations. In other embodiments, the number of appearance of variables that appear the smallest number of times may be increased or maximized. In yet other embodiments\, the number of appearance of Q (a constant) variables with rarest representation may be increased or maximized. In still other embodiments, the ratio of the variable that appears the least number of times with respect to the total number of equations may be optimized. In yet still other embodiments, the weighted number of appearance of a variable, where the weight is proportional to the coefficient in front of the variable, may be increased or maximized.

Another pre-processing technique may be equation selection based on distance. Using this technique, the accuracy of CS-based gate-level leakage power characterization may be improved by repeating the measurement procedure a user-specified or predetermined number of times. In each iteration, a subset of equations with the cardinality (defined as number of members in a set) specified by the user or as predetermined may be selected. In some embodiments, the equations may be selected so as to increase or maximize a function defined over a Hamming distance between the equations. An increased Hamming distance between equations causes the equations to be more independent, and/or reduce or eliminate dependency among the equations. The Hamming distance may be defined as 0 if either a specific equation appears in a pair of subsets or none. Otherwise, the Hamming distance is set to 1. In other embodiments, a dissimilarity function may be defined as a function of difference between how many times each variable appears in each pair of the equation subsets.

Figure 7:
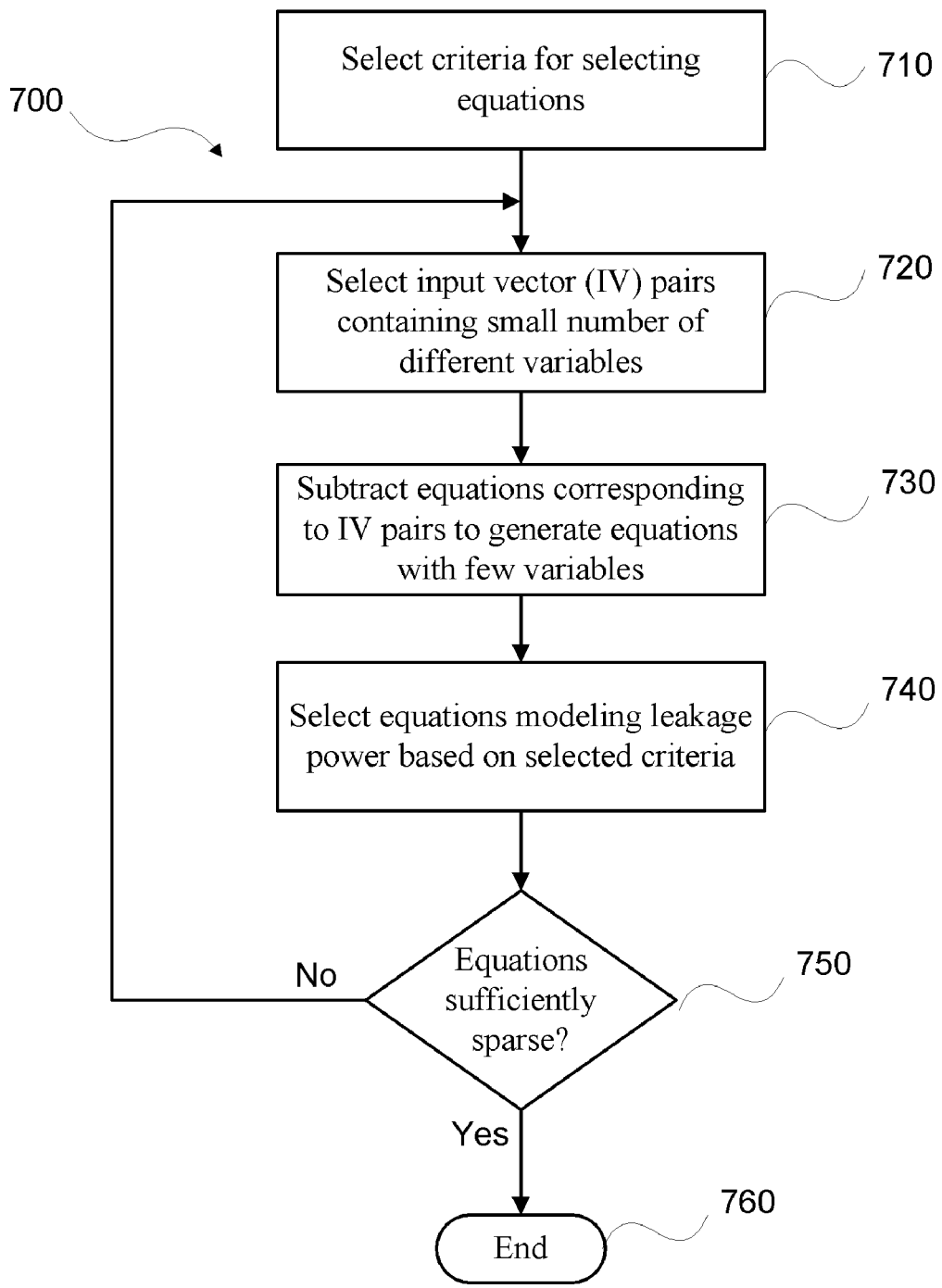

FIG. 7 is a flowchart of an illustrative method 700 for selecting sparse equations based on application of IV to the IC, in accordance with various embodiments of the present disclosure. At block 710 ("Select criteria for selecting equations"), one of the criteria disclosed above for selection of equations based on IV selection may be selected. These criteria may include number and appearance of variables in various equations, as detailed above.

At block 720 ("Select Input Vector (IV) pairs containing small number of different variables"), IV pairs may be selected that may result in sparse output equations that contain a small number of variables that are different between the IVs in the IV pairs.

At block 730 ("Subtract equations corresponding to IV pairs to generate equations with few variables"), the equations may be derived based on the IV pairs may be subtracted from each other to produce new equations. The new equations may generally have fewer variables and will result in a smaller system of equations that may be more easily solved.

At block 740 ("Select equations modeling leakage power based on selected criteria"), equations may be selected based on the chosen criteria to form the system of equations for modeling leakage power characteristics of IC 204. As discussed above, in some embodiments, the chosen criteria may include selection of sparse equations that allow as many variables as possible to appear in an equal number of equations. In other embodiments, the number of appearance of variables that appear the smallest number of times may be increased or approximately maximized. In yet other embodiments, the number of appearance of Q variables with rarest representation may be approximately maximized. In still other embodiments, the ratio of the variable that appears the least number of times with respect to the total number of equations may be optimized. In yet other embodiments, the weighted number of appearance of a variable, where the weight may be proportional to the coefficient in front of the variable, may be increased or approximately maximized.

At decision block 750 (Equations sufficiently sparse?"), the process may ascertained whether the selected equations are sufficiently sparse or not. In some embodiments, this decision may be made based on the number of equations and/or variables in the final system of equations. In other embodiments, this determination may be made based on computational performance and resources, for example, how much time may be needed to solve the system of equations. In yet other embodiments, this determination may be made based on accuracy of the results of solving the system of equations. If the equations are not sufficiently sparse, the process may proceed from decision block 750 to block 720. Otherwise, the process may proceed from decision block 750 to block 760 ("End") where the process may terminate.

Another pre-processing technique may be splitting variables. This technique may be used for improving the accuracy of CS-based gate-level leakage power characterization by splitting all or a user-specified or predetermined number of variables into two of more replicas that may be treated as separate variables by the consequently applied CS-based procedure for solving a system of linear equations. In some embodiments, each selected variable may be split in such a way that each replica of the selected variable appears in disjoint sets of other variables over all equations. In other embodiments, selected variables may be split in such a way that correlations (for example, having similar or close values) between different replicas of the pairs of the selected variables may be increased or maximized. At least two major benefits may be realized by splitting variables. First, splitting variables may provide a relatively effective and inexpensive way to establish and verify the accuracy of the overall procedure. This is so because if all replicas of each split variable produce identical or very similar values, upon solution of the system of equations, then that may be a strong indicator that the overall procedure may be accurate. However, if there is a significant discrepancy between the values produced by the replicas of the variables, then that may be an indication or sign that additional measurements have to be performed with emphasize on the variables that have the highest discrepancy. Second, different replicas of the variables may be mutually grouped according to different similarity criteria due to physical proximity. Therefore, now the CS-based gate-level leakage power characterization may be provided with suitable and appropriate proximity approximation.

Post-processing for Compressive Sensing

In addition to the pre-processing techniques, a number of post-processing techniques may also be used to improve the accuracy of the device characterization through solving the set of sparse equations using CS techniques. These techniques may include performing multiple runs of measurements, conducting learn and test procedure, bootstrapping, and establishing interval of confidence.

Some post-processing techniques may include performing multiple runs of measurements. In these techniques, multiple runs of the basic procedure discussed above for calculating Equation (3) may be performed and the solution obtained for each variable may be statistically processed. In some embodiments, statistical measures may be used, such as average, median, and the like, to calculate the statistical value of each variable. In other embodiment, a percentage of the most extreme values (statistical outliers) may be eliminated before applying a statistical selection function for the calculation of the value of each variable.

Additional post-processing techniques may include conducting a learn and test procedure. Using these techniques, statistical models may be created for the value of each variable where the explanatory variables of the statistical models include the properties of the equations (for example, how many times a particular variable appears) and measurements (for example, the expected error, the average, or the median value of all measurements used in a particular run). The accuracy of each statistical model may be evaluated using new runs of the procedure for CS-based gate-level characterization and the model with best predictive capabilities may be accepted as the overall solution. In some embodiments, meta-level models (models of models) may be used for creating an instance of the CS with perceived best statistical properties that may be used as the final solution.

In some embodiments, post-processing techniques may include bootstrapping. The bootstrap procedure may first used to create statistical models for value of each variable where the explanatory variables include the properties of the equations (for example, how many times a particular variable appears) and measurements (for example, the expected error or the average or the median value of all measurements used in a particular run). The accuracy of each model may be evaluated using the existing runs (different from the learn and test procedure) of the procedure for CS-based gate-level characterization and the model with best prediction abilities may be accepted as the overall solution. In other embodiments, the meta-level models may be used for creating an instance of the CS with perceived best statistical properties that may be used as the final solution.

In some additional embodiments, post-processing techniques may include establishing interval of confidence. Establishing an interval of confidence and/or other statistical validation measures may be accomplished by applying bootstrap, learn and test procedure, as discussed above, and/or other statistical validation techniques on the results of the multiple runs of the procedure for CS-based gate-level characterization. In some embodiments, establishing the interval of confidence and other statistical validation measures may be accomplished by using physical laws and/or characteristics, such as analyzing and using the locality properties of the calculated leakage power of each gate.

Article of Manufacture

FIG. 8 illustrates an example article of manufacture having a computing program product 801 in accordance with various embodiments of the present disclosure. In various embodiments, computing program product 801 may comprise a signal bearing medium 803 having programming instructions stored therein. The computing signal bearing medium 803 may be, for example, a compact disk (CD), a digital versatile disk (DVD), a solid-state drive, a hard drive, or other appropriate type of data/instruction storage medium. The computing signal bearing medium 803 may have stored therein in a number of programming instructions 805. The programming instructions 805 when executed by a processor of an apparatus may cause the apparatus to determine a system of leakage power equations for the gates within IC 204. In various embodiments, when executed, the programming instructions 805 may also cause the apparatus to preprocess the system of equations according to a number of techniques such as grouping gates, splitting variables, splitting equations, and using multiple approximation grids, among others, as described above, to make the equations sparse and suitable for use with compressive sensing. In alternate embodiments, the programming instructions 805 when executed, may cause the apparatus to determine a system of leakage power equation for gates as well as other devices within IC 204. The programming instructions 805 when executed, may also cause the apparatus to preprocess the system of equations, including grouping of the gates as well as other devices within IC 204. In still other or same embodiments, when executed, the programming instructions 805 may also cause the apparatus to post-process the results of solving the leakage power equations to improve the accuracy of the device characterizations. These post-processing techniques may include performing multiple runs of measurements, conducting learn and test procedure, bootstrapping, and establishing interval of confidence. Embodiments are not limited to any type or types of computing program products.

In various embodiments, the signal bearing medium 803 may include a computer readable medium 807, including but not limited to a CD, a DVD, a solid-state drive, a hard drive, computer disks, flash memory, or other appropriate type of computer readable medium. In various embodiments, the signal bearing medium 803 may also include a recordable medium 809, including but not limited to a floppy disk, a hard drive, a CD, a DVD, a digital tape, a computer memory, a flash memory, or other appropriate type of computer recordable medium. In various embodiments, the signal bearing medium 803 may include a communications medium 811, including but not limited to a fiber optic cable, a waveguide, a wired or wireless communications link, etc.

Computing System

Figure 9:
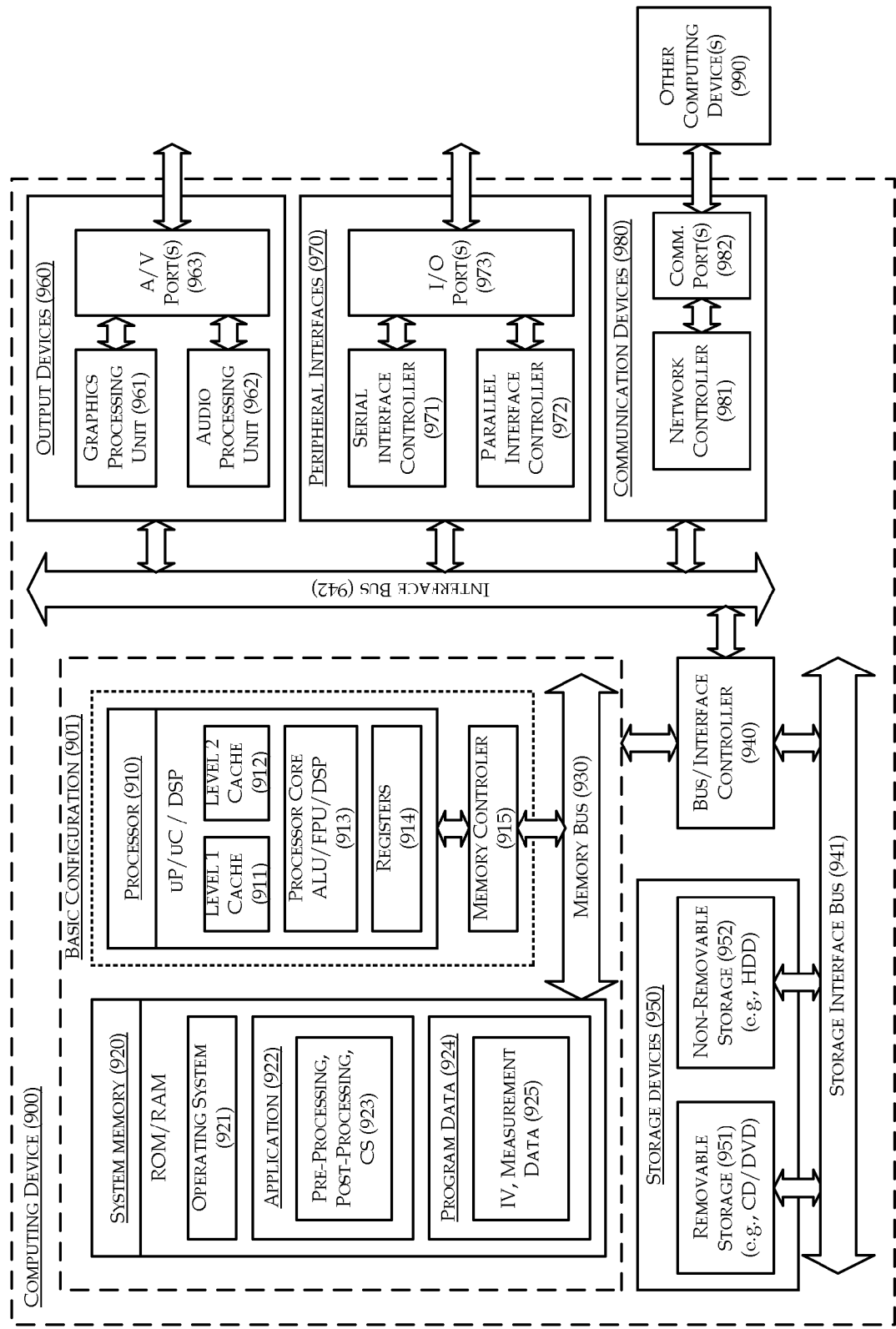

FIG. 9 is a block diagram illustrating an example computing device 900 that is arranged for selecting input vectors for reducing or minimizing leakage current of a number of IC in view of MC, in accordance with the various embodiments of the present disclosure. In a very basic configuration 901, computing device 900 may typically includes one or more processors 910 and system memory 920. A memory bus 930 may be used for communicating between the processor 910 and the system memory 920

Depending on the desired configuration, processor 910 may be of any type including but not limited to a microprocessor ($\mu$P), a microcontroller ($\mu$C), a digital signal processor (DSP), or any combination thereof Processor 910 may include one more levels of caching, such as a level one cache 911 and a level two cache 912, a processor core 913, and registers 914. An example processor core 913 may include an arithmetic logic unit (ALU), a floating point unit (FPU), a digital signal processing core (DSP Core), or any combination thereof An example memory controller 915 may also be used with the processor 910, or in some implementations the memory controller 915 may be an internal part of the processor 910.

Depending on the desired configuration, the system memory 920 may be of any type including but not limited to volatile memory (such as RAM), non-volatile memory (such as ROM, flash memory, etc.) or any combination thereof System memory 920 may include an operating system 921, one or more applications 922, and program data 924. Application 922 may include programming instructions 923 to perform the operations associated with various methods described herein. In some examples, the programming instructions may include instructions for performing the gate-level characterizations, and specialized IV selection described for embodiments of method 100 (i.e., methods 600 and 700), including instructions for performing the earlier described pre-processing of leakage power equations, post-processing of results of solving the leakage power equations, and CS processing. Program Data 924 may include data associated the ICs, the input vectors selected for the IC, and/or programming instructions 923.

Computing device 900 may have additional features or functionality, and additional interfaces to facilitate communications between the basic configuration 901 and any required devices and interfaces. For example, a bus/interface controller 940 may be used to facilitate communications between the basic configuration 901 and one or more data storage devices 950 via a storage interface bus 941. The data storage devices 950 may be removable storage devices 951, non-removable storage devices 952, or a combination thereof Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of device 900.

Computing device 900 may also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which may be configured to communicate to various external devices such as a display or speakers via one or more A/V ports 963. Example peripheral interfaces 970 include a serial interface controller 971 or a parallel interface controller 972, which may be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which may be arranged to facilitate communications with one or more other computing devices 990 over a network communication link via one or more communication ports 982.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

In conclusion, embodiments have addressed post-silicon leakage current/power characterization by determining a system of leakage power equations for the devices within the IC. The system of equations may be preprocessed according to a number techniques such as grouping devices, splitting variables, splitting equations, and using multiple approximation grids, among others, as described above, to make the equations sparse and suitable for use with compressive sensing. In addition, post-processing of computational results, such as performing multiple runs of measurements, conducting learn and test procedure, among others, as described above, to further improve the accuracy of compressive sensing measurements and leakage power characterization.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a storage medium or storage media. This storage media, such as CD-ROMs, computer disks, flash memory, or the like, for example, may have instructions stored thereon, that, when executed by a system, such as a computer system, computing platform, or other system, for example, may result in execution of a processor in accordance with claimed subject matter, such as one of the implementations previously described, for example. As one possibility, a computing platform may include one or more processing units or processors, one or more input/output devices, such as a display, a keyboard and/or a mouse, and one or more memories, such as static random access memory, dynamic random access memory, flash memory, and/or a hard drive.

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

In the preceding description, various aspects of claimed subject matter have been described. For purposes of explanation, specific numbers, systems and/or configurations were set forth to provide a thorough understanding of claimed subject matter. However, it should be apparent to one skilled in the art and having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now, or in the future, occur to those skilled in the art. It is, therefore, to be understood that the appended claims are intended to cover all such modifications and/or changes as fall within the true spirit of claimed subject matter.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that individual function and/or operation within such block diagrams, flowcharts, or examples may be implemented, individually and/or collectively, by a wide range of hardware, software, firmware, or virtually any combination thereof In some embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed is:

1. A method for characterizing leakage power of devices of an integrated circuit (IC) having devices, the method comprising:
receiving, by a computing device, a specification of the IC; and
forming, with the computing device, one or more groupings of the devices using the specification, wherein each selected group from the one or more groups is formed by:
grouping an initial number of the devices into the selected group based on the specification;
successively expanding the selected group to include additional ones of the devices that are either similar to the devices included in the selected group or within a predetermined distance or proximity to devices included in the select group;
wherein the selected group is configured to allow a set of sparse equations to be used in conjunction with power measurements of the IC to determine leakage power characteristics of the devices;
wherein the measurements are taken in response to input vectors applied to the IC, and correspond to the equations, solutions to which equations provide the leakage power characteristics of the devices; and
wherein the one or more groupings of the devices are formed to increase sparseness of the set of equations.

2. The method of claim 1, wherein forming one or more groups of the devices comprises forming one or more groups of devices for use to take measurements that are configured for post-processing.

3. The method of claim 2, wherein post-processing comprises performing statistical processing of the measurements.

4. The method of claim 2, wherein post-processing comprises performing bootstrapping of the measurements.

5. The method of claim 1, wherein forming one or more groups of the devices comprises using a grid to identify a subset of the devices within a selected group from the one or more groups, wherein a distance of each device in the subset to an intersection point of the grid is less than a predetermined threshold.

6. An apparatus, comprising:
a processor; and
a computer-readable storage medium coupled to the processor and having stored therein a plurality of programming instructions configured to be executed by the processor, wherein when executed, cause the apparatus to:
receive, by the processor, a specification of the IC; and
form, with the processor, one or more groups of the devices using the specification, for use with a set of sparse equations, in conjunction with power measurements of the IC to determine leakage power characteristics of the devices, wherein each selected group from the one or more groups is formed by: grouping an initial number of devices into the selected group using the specification, and successively expanding the selected group to include additional devices that are similar to the devices included in the selected group or within a predetermined distance or proximity to the devices included in the selected group;
wherein the measurements are taken in response to input vectors applied to the IC, and correspond to the set of equations, solutions to which equations provide said leakage power characteristics of the devices; and
wherein the one or more groups of the devices are formed to increase sparseness of the set of equations.

7. The apparatus of claim 6, wherein the programming instructions configured to cause the apparatus, when executed, to select the plurality of IVs are further arranged to select the plurality of IVs to increase sparseness of the set of equations.

8. The apparatus of claim 6, wherein the programming instructions are further configured to cause the apparatus, when executed, to increase sparseness of the set of equations with a pre-processing technique.

9. The apparatus of claim 8, wherein the programming instructions are further configured to cause the apparatus, when executed, to select the set of equations based on a Hamming distance between the equations to make the set of equations more sparse.

10. The apparatus of claim 6, wherein the programming instructions are further configured to cause the apparatus, when executed, to form the one or more groups of the devices for use to take measurements, and to apply a post-processing technique.

11. The apparatus of claim 10, wherein the programming instructions are further configured to cause the apparatus, when executed, to establish an interval of confidence to post-process the measurements.

* * * * *

UNITED STATES PATENT AND TRADEMARK OFFICE
CERTIFICATE OF CORRECTION

PATENT NO. : 8,286,120 B2
APPLICATION NO. : 12/541098
DATED : October 9, 2012
INVENTOR(S) : Potkonjak Page 1 of 2

It is certified that error appears in the above-identified patent and that said Letters Patent is hereby corrected as shown below:

On the Cover Page, item (56), under "OTHER PUBLICATIONS", in Column 2, Line 2, delete "Ghz"." and insert -- GHz", --, therefor.

On the Cover Page, item (56), under "OTHER PUBLICATIONS", in Column 2, Line 4, delete "2009. IEEE." and insert -- 2009, IEEE, --, therefor.

On the Cover Page, item (56), under "OTHER PUBLICATIONS", in Column 2, Line 9, delete "security."" and insert -- security," --, therefor.

On the Cover Page, item (56), under "OTHER PUBLICATIONS", in Column 2, Line 11, delete "transformations."" and insert -- transformations," --, therefor.

On Page 2, item (56), under "OTHER PUBLICATIONS", in Column 1, Line 2, delete "correlations."" and insert -- correlations," --, therefor.

On Page 2, item (56), under "OTHER PUBLICATIONS", in Column 1, Line 6, delete "profile."" and insert -- profile," --, therefor.

On Page 2, item (56), under "OTHER PUBLICATIONS", in Column 1, Line 8, delete "reduction. IEEE Trans."" and insert -- reduction," Trans. --, therefor.

On Page 2, item (56), under "OTHER PUBLICATIONS", in Column 2, Line 62, delete "et al," and insert -- et al., --, therefor.

In the drawings: In Figure 8, Sheet 8 of 9, delete "Fig. 8" and insert -- FIGURE 8 --, therefor.

In the drawings: In Figure 9, Sheet 9 of 9, below "PROCESSOR (910)", in Line 1, delete "UP/UC/" and insert -- $\mu P/\mu C/$ --, therefor.

Signed and Sealed this
Twelfth Day of March, 2013

Teresa Stanek Rea
*Acting Director of the United States Patent and Trademark Office*

CERTIFICATE OF CORRECTION (continued)

U.S. Pat. No. 8,286,120 B2

In the drawings: In Figure 9, Sheet 9 of 9, in Box "(915)", in Line 1, delete "CONTROLER" and insert -- CONTROLLER --, therefor.

In Column 1, Line 8, delete "(IC)" and insert -- (ICs) --, therefor.

In Column 2, Line 28, delete "hereof" and insert -- hereof. --, therefor.

In Column 2, Line 64, delete "alias" and insert -- alia, --, therefor.

In Column 5, Line 46, delete "note" and insert -- noted --, therefor.

In Column 9, Line 9, delete "L1" and insert -- $L_1$ --, therefor.

In Column 11, Line 18, delete "distances" and insert -- distances. --, therefor.

In Column 18, Line 14, delete "thereof" and insert -- thereof. --, therefor.

In Column 18, Line 20, delete "thereof" and insert -- thereof. --, therefor.

In Column 18, Line 27, delete "thereof" and insert -- thereof. --, therefor.

In Column 18, Line 50, delete "thereof" and insert -- thereof. --, therefor.

In Column 18, Line 53, delete "(HDD)," and insert -- (HDDs), --, therefor.

In Column 18, Line 55, delete "(SSD)," and insert -- (SSDs), --, therefor.

In Column 21, Line 4, delete "thereof" and insert -- thereof. --, therefor.